United States Patent
Lee et al.

(10) Patent No.: US 9,074,615 B2
(45) Date of Patent: Jul. 7, 2015

(54) FIXING MECHANISM AND RELATED PANEL MODULE

(71) Applicant: Wistron Corporation, New Taipei (TW)

(72) Inventors: Ming-Hsi Lee, New Taipei (TW); Chia-Chi Chang, New Taipei (TW)

(73) Assignee: Wistron Corporation, Hsichih, New Taipei (TW)

(*) Notice: Subject to any disclaimer, the term of this patent is extended or adjusted under 35 U.S.C. 154(b) by 442 days.

(21) Appl. No.: 13/711,600

(22) Filed: Dec. 11, 2012

(65) Prior Publication Data

US 2014/0071599 A1 Mar. 13, 2014

(30) Foreign Application Priority Data

Sep. 12, 2012 (TW) .............................. 101133348 A

(51) Int. Cl.
| | |
|---|---|
| *F16B 2/12* | (2006.01) |
| *F16B 2/20* | (2006.01) |
| *H05K 7/18* | (2006.01) |
| *G06F 1/16* | (2006.01) |
| *F16B 5/06* | (2006.01) |

(52) U.S. Cl.
CPC .. *F16B 2/20* (2013.01); *H05K 7/18* (2013.01); *G06F 1/1609* (2013.01); *G06F 1/1637* (2013.01); *F16B 2/12* (2013.01); *F16B 5/0635* (2013.01); *F16B 5/0642* (2013.01)

(58) Field of Classification Search
CPC combination set(s) only.
See application file for complete search history.

(56) References Cited

U.S. PATENT DOCUMENTS

| | | | | |
|---|---|---|---|---|
| 4,633,322 | A | * | 12/1986 | Fourny ........................... 348/834 |
| 4,905,089 | A | * | 2/1990 | Liang et al. .................... 348/819 |
| 5,227,916 | A | * | 7/1993 | Theirl et al. ................... 359/609 |
| 5,668,612 | A | * | 9/1997 | Hung ............................. 348/818 |
| 5,803,424 | A | * | 9/1998 | Keehn et al. ................... 248/489 |
| 5,900,979 | A | * | 5/1999 | Heller et al. ................... 359/609 |
| 5,909,315 | A | * | 6/1999 | Keehn ............................ 359/609 |
| 5,971,548 | A | * | 10/1999 | Hung ............................. 359/609 |
| 6,144,418 | A | * | 11/2000 | Kappel et al. ................. 348/834 |
| 6,356,439 | B1 | * | 3/2002 | Schmidt .................... 361/679.24 |
| 6,469,752 | B1 | * | 10/2002 | Ishikawa et al. .............. 348/834 |
| 6,750,922 | B1 | * | 6/2004 | Benning ....................... 348/818 |
| 6,765,550 | B2 | | 7/2004 | Janick |

(Continued)

FOREIGN PATENT DOCUMENTS

| | | |
|---|---|---|
| TW | M312725 | 5/2007 |
| TW | M409466 | 8/2011 |

OTHER PUBLICATIONS

Office action mailed on Jul. 22, 2014 for the Taiwan application No. 101133348, filing date: Sep. 12, 2012, p. 1 line 14, p. 2 line 1~18 and line 22~26, p. 3 line 1~18 and line 21~26.

*Primary Examiner* — Lisa Lea Edmonds
(74) *Attorney, Agent, or Firm* — Winston Hsu; Scott Margo

(57) ABSTRACT

A fixing mechanism for fixing a privacy filter on a bezel is disclosed. The fixing mechanism includes a body, a first hook and a second hook. The body surrounds the bezel, and a guiding slot is formed on the body. The first hook is disposed on a side of the body, and the second hook is slidably disposed on the other side of the body. The second hook includes a buckling portion and a guiding portion. The buckling portion buckles the privacy filter with the first hook. An end of the guiding portion is connected to the buckling portion. The guiding portion is movably disposed inside the guiding slot, so as to adjust a distance between the buckling portion and the first hook.

15 Claims, 6 Drawing Sheets

(56) References Cited

U.S. PATENT DOCUMENTS

| | | | |
|---|---|---|---|
| 6,989,916 B2 * | 1/2006 | Lichtfuss | 358/474 |
| 7,226,176 B1 * | 6/2007 | Huang | 359/609 |
| 7,508,657 B1 * | 3/2009 | Smith | 361/679.27 |
| 7,826,207 B2 * | 11/2010 | Wang | 361/679.22 |
| 8,050,022 B2 * | 11/2011 | McIntyre | 361/679.24 |
| 8,371,704 B1 * | 2/2013 | Lin | 359/613 |
| 8,416,350 B2 * | 4/2013 | Tsanev et al. | 348/841 |
| 8,437,124 B2 * | 5/2013 | Dai | 361/679.24 |
| 2002/0158967 A1 * | 10/2002 | Janick et al. | 348/87 |
| 2002/0176170 A1 * | 11/2002 | Huang | 359/609 |
| 2003/0223119 A1 * | 12/2003 | Heiman | 359/610 |
| 2005/0094362 A1 * | 5/2005 | Stephens | 361/681 |
| 2005/0207102 A1 * | 9/2005 | Russo | 361/683 |
| 2006/0044290 A1 * | 3/2006 | Hurwitz et al. | 345/204 |
| 2006/0198087 A1 * | 9/2006 | Anderson et al. | 361/681 |
| 2007/0030633 A1 * | 2/2007 | Tseng | 361/681 |
| 2007/0188687 A1 * | 8/2007 | She | 349/122 |
| 2007/0253065 A1 * | 11/2007 | Doczy et al. | 359/601 |
| 2007/0279853 A1 * | 12/2007 | Hung et al. | 361/683 |
| 2010/0253875 A1 * | 10/2010 | Hu et al. | 349/60 |
| 2010/0254014 A1 * | 10/2010 | Trinh et al. | 359/601 |
| 2010/0258691 A1 * | 10/2010 | Zdancewicz et al. | 248/229.26 |
| 2011/0134534 A1 * | 6/2011 | Luo | 359/601 |
| 2012/0033304 A1 * | 2/2012 | Kim | 359/614 |

\* cited by examiner

FIXING MECHANISM AND RELATED PANEL MODULE

BACKGROUND OF THE INVENTION

1. Field of the Invention

The present invention relates to a fixing mechanism for the privacy filter and a related panel module, and more particularly, to an adjustable fixing mechanism for all dimensions of the privacy filter and a related panel module.

2. Description of the Prior Art

Popularity of portable computer and wireless network makes the consumer can easily carry the notebook computer or the tablet computer to any place. Brightness display provides colorful performance for entertainment, and data performed on the display can be easily viewed by stranger. Thus, the privacy filter applied to the portable computer is designed for data protection. The conventional privacy filter is adhered to the bezel of the display, which is inaesthetic. Furthermore, dimension of the privacy filter may be not matched with the display, and the privacy filter is cut to the suitable size to be adhered to the display. Therefore, design of an aesthetic fixing mechanism capable of fixing different dimensions of the privacy filter on the display is an important issue in the mechanical industry.

SUMMARY OF THE INVENTION

The present invention provides an adjustable fixing mechanism for all dimensions of the privacy filter and a related panel module for solving above drawbacks.

According to the claimed invention, a fixing mechanism includes a body, a first hook and a second hook. The body surrounds a bezel, and a guiding slot being formed on a side of the body. The first hook is disposed on the other side of the body. The second hook is slidably disposed on the side of the body. The second hook includes a buckling portion and a guiding portion. The buckling portion and the first hook respectively buckle two edges of a privacy filter. An end of the guiding portion is connected to the buckling portion. The guiding portion is movably disposed inside the guiding slot, so as to adjust a distance between the buckling portion and the first hook.

According to the claimed invention, the first hook and the second hook are respectively disposed on the opposite sides of the body.

According to the claimed invention, the second hook further includes a constraining portion and a positioning portion. Two ends of the guiding portion are respectively connected to the buckling portion and the constraining portion. The positioning portion is disposed on the body. The positioning portion is a multi-station stopper for stopping the constraining portion, so as to constrain a movement of the buckling portion relative to the body.

According to the claimed invention, the buckling portion is disposed on an upper surface of the body, and the constraining portion is disposed on a low surface of the body.

According to the claimed invention, the positioning portion is the stopper with curved structures, and the constraining portion is blocked between the adjacent curved structures.

According to the claimed invention, the positioning portion is combined with the body via a heat stake.

According to the claimed invention, the second hook further includes a wedging portion disposed on an end of the buckling portion. The wedging portion is wedged inside a hole on the bezel.

According to the claimed invention, a panel module includes a panel, a bezel and a fixing mechanism. A privacy filter is disposed on a surface of the panel. The panel is disposed inside the bezel. The bezel includes an opening structure. The fixing mechanism is disposed on the bezel. The fixing mechanism includes a body, a first hook and a second hook. The body surrounds a bezel, and a guiding slot being formed on a side of the body. The first hook is disposed on the other side of the body. The second hook is slidably disposed on the side of the body. The second hook includes a buckling portion and a guiding portion. The buckling portion and the first hook respectively buckle two edges of a privacy filter. An end of the guiding portion is connected to the buckling portion. The guiding portion is movably disposed inside the guiding slot, so as to adjust a distance between the buckling portion and the first hook.

According to the claimed invention, the fixing mechanism is integrated with the bezel monolithically in a double injection molding manner.

The fixing mechanism of the present invention is adjustable according to the dimensions of the privacy filter. An edge of the privacy filter can be set inside the first hook, then the privacy filter is rotated to cover the panel, and the second hook is moved to the suitable position for buckling the privacy filter according to the dimensions of the privacy filter. Final, the opposite edges of the privacy filter can be tightly hooked by the first hook and the second hook. Therefore, the fixing mechanism of the present invention is aesthetic, and has advantages of, friction-proofing and adjustable function.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
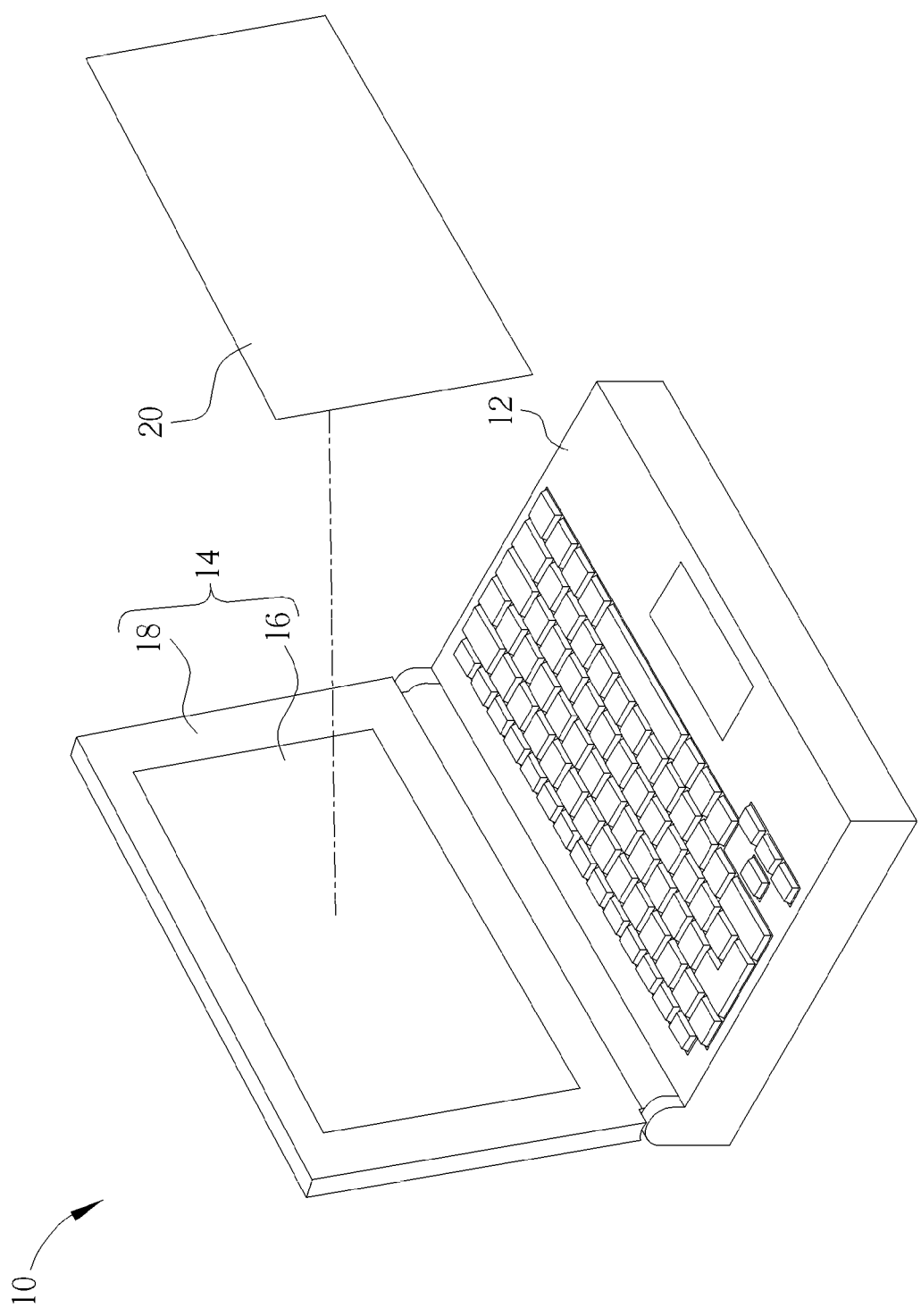
FIG. 1 is a diagram of an electronic device according to an embodiment of the present invention.

Please refer to FIG. 1. FIG. 1 is a diagram of an electronic device 10 according to an embodiment of the present invention. The electronic device 10 can be a notebook computer or a tablet computer. As the notebook computer is used in the embodiment, the electronic device 10 includes a host 12 and a screen 14. The host 12 can include a plurality of electronic components, such as a keyboard module, a motherboard, a processor, a hard disk, an optical disk and a memory module. The screen 14 can include a panel module 16 and a casing 18. The panel module 16 is disposed inside the casing 18 and electrically connected to the motherboard of the host 12, so as to perform data of the memory module. A privacy filter 20 can cover above a surface of the panel module 16. The privacy filter 20 can control a refraction angle of the beam, to prevent the data performed on the panel module 16 from peek.

Figure 2:
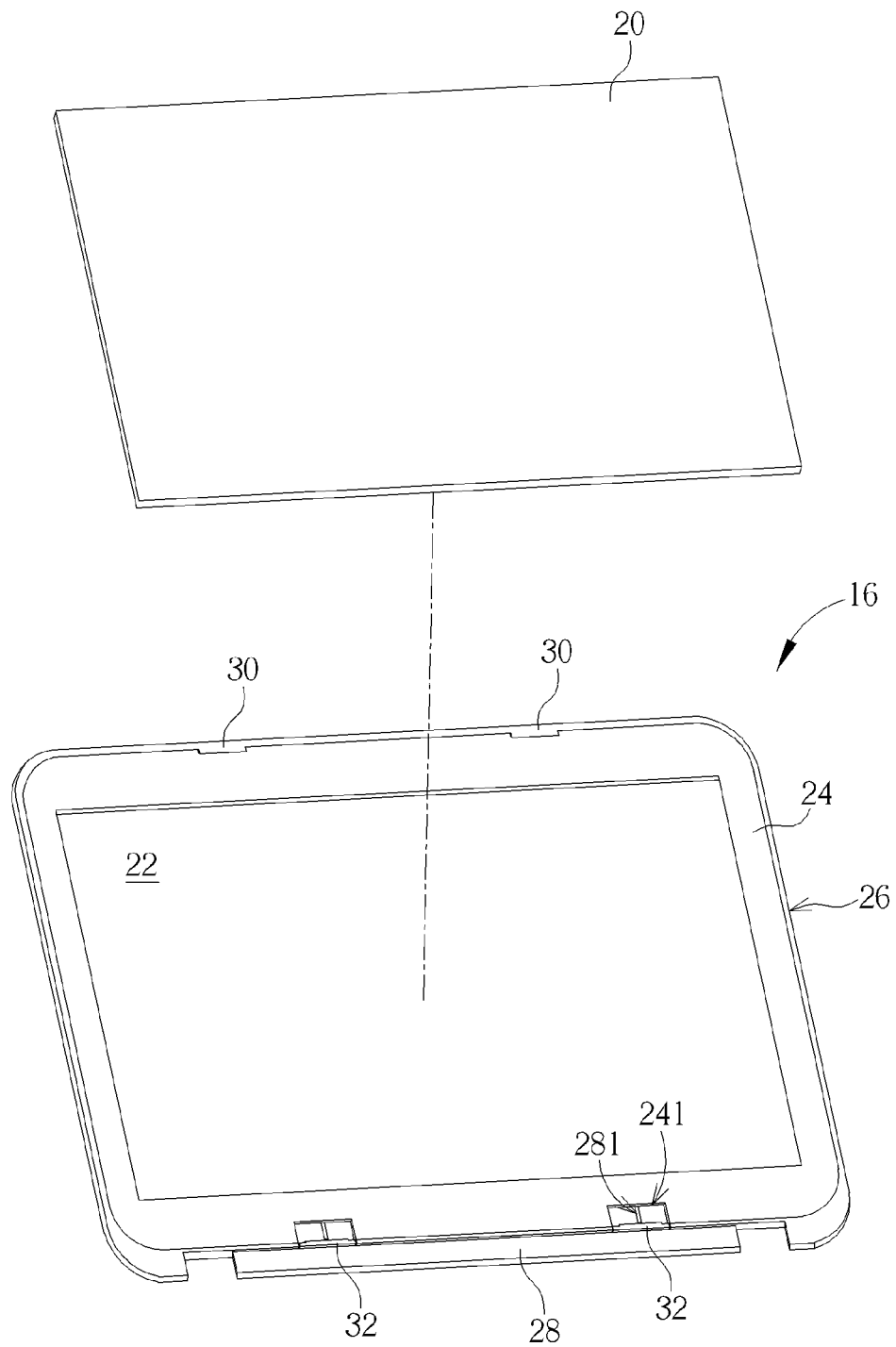
FIG. 2 is a diagram of a panel module according to the embodiment of the present invention.

Please refer to FIG. 2. FIG. 2 is a diagram of the panel module 16 according to the embodiment of the present invention. The panel module 16 includes a panel 22, a bezel 24 and a fixing mechanism 26. The panel 22 is disposed inside the bezel 24. The fixing mechanism 26 can be integrated with the bezel 24 monolithically in a double injection molding manner. The fixing mechanism 26 includes a body 28, two first hooks 30 and two second hooks 32. The body 28 is hidden under the casing 18 from the view. The first hook 30 and the second hook 32 are exposed over the casing 18 for operation of the fixing mechanism 26. The body 28 is disposed on a boundary of the bezel 24 by surrounding the bezel 24, and the first hook 30 and the second hook 32 are respectively disposed on two opposite sides of the body 28, such as an upper side and a low side. The privacy filter 20 is disposed above the panel 22. The first hook 30 and the second hook 32 can buckle two edges of the privacy filter 20 to keep buckling stability and to prevent the privacy filter 20 from separating from the panel 22.

Figure 3:
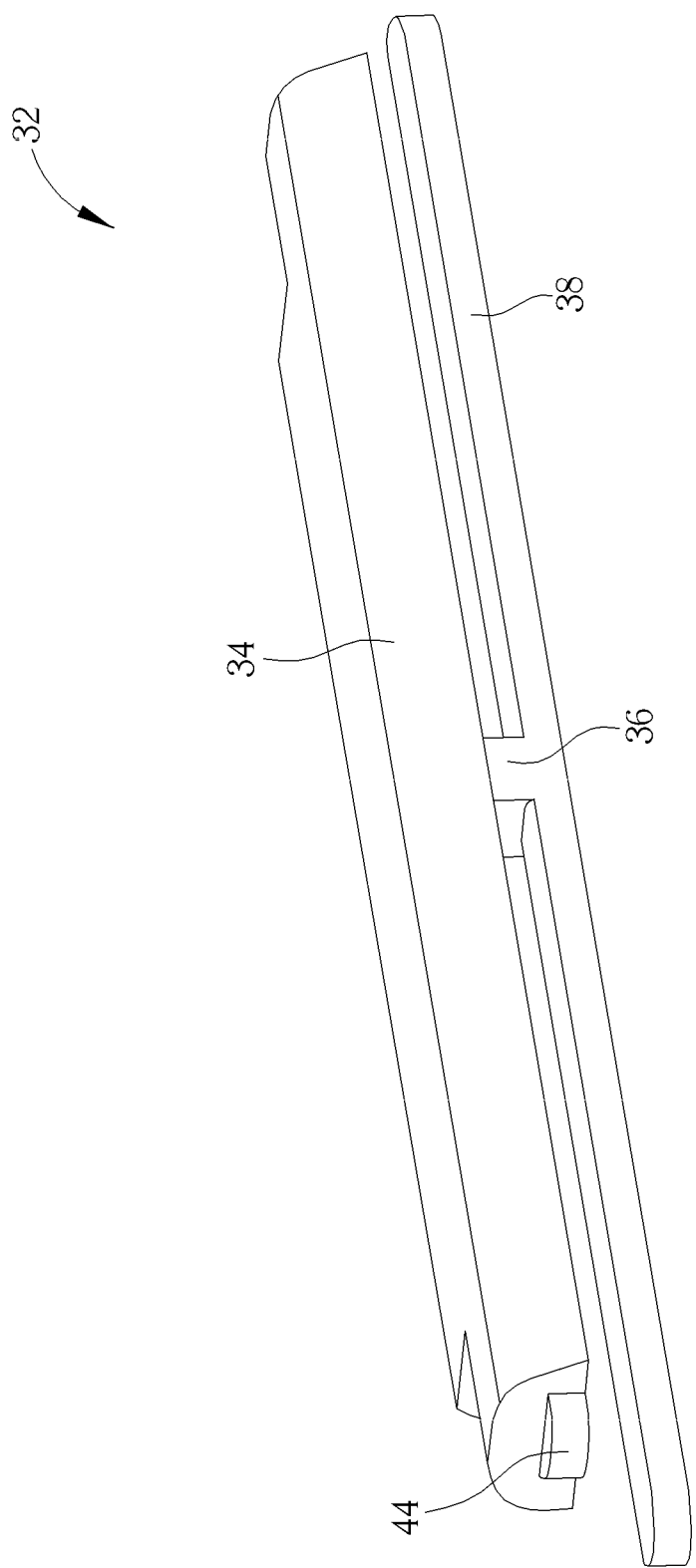
FIG. 3 is a diagram of a second hook according to the embodiment of the present invention.
Figure 4:
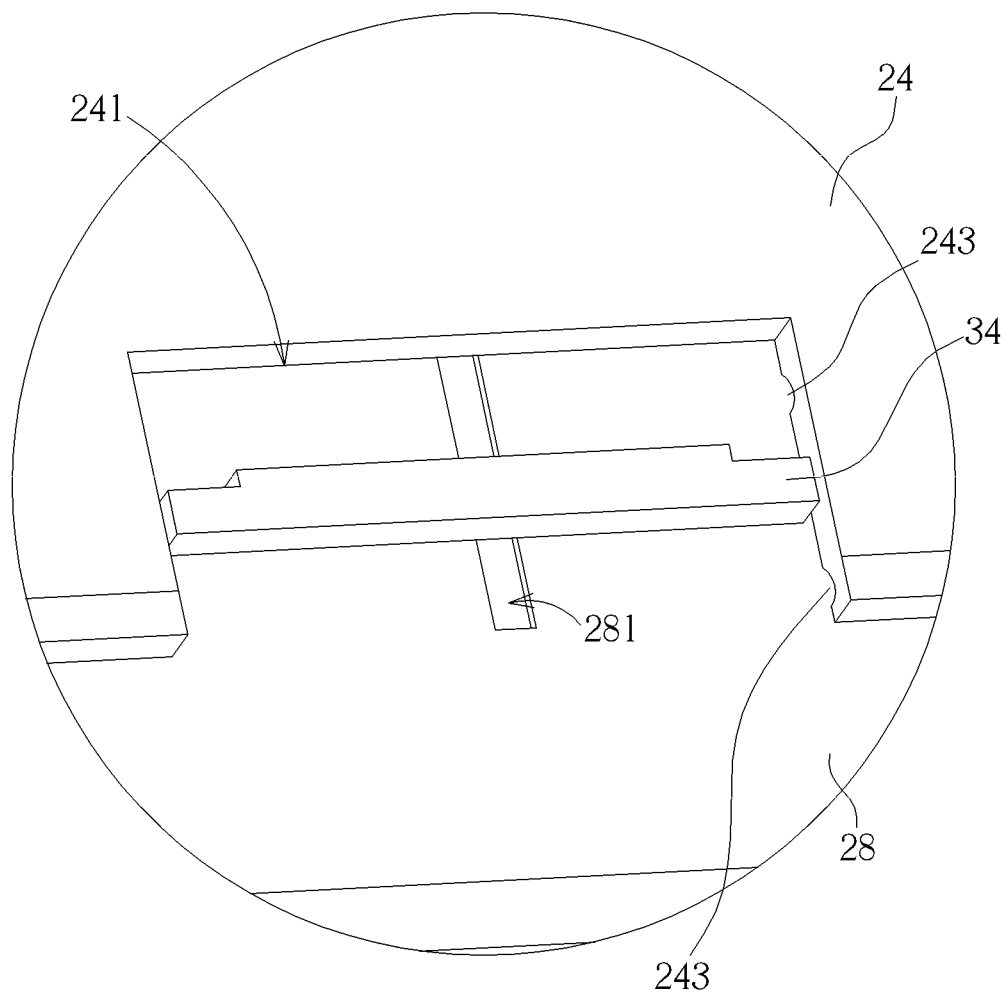
FIG. 4 is a diagram of the panel module according to the embodiment of the present invention.

The first hook 30 can be an immovable hook, and the second hook 32 can be a movable hook. Please refer to FIG. 3 and FIG. 4. FIG. 3 is a diagram of the second hook 32 according to the embodiment of the present invention. FIG. 4 is a diagram of the panel module 16 according to the embodiment of the present invention. As shown in FIG. 3, the second hook 32 includes a buckling portion 34, a guiding portion 36 and a constraining portion 38. Two ends of the guiding portion 36 are respectively connected to the buckling portion 34 and a middle of the constraining portion 38, which means the second hook 32 can be a H-shaped structure. As shown in FIG. 4, two opening structures 241 are formed on the bezel 24. Each second hook 32 can move inside the corresponding opening structure 241, and an amount of the opening structure 241 corresponds to an amount of the second hook 32.

In addition, a guiding slot 281 is formed on a side of the body 28, and the guiding portion 36 of the second hook 32 can be movably disposed inside the guiding slot 281 (not shown in FIG. 4). The second hook 32 can slide at a structural direction of the guiding slot 281, so as to adjust a distance between the buckling portion 34 and the first hook 30. The second hook 32 can not move at a direction different from the structural direction of the guiding slot 281 for the preferred buckling stability. Therefore, the fixing mechanism 26 can be an adjustable fixing mechanism. Position of the second hook 32 relative to the first hook 30 can be adjusted according to dimensions of the privacy filter 20, so as to utilize the buckling portion 34 and the first hook 30 to tightly buckle the edges of the privacy filter 20.

Figure 5:
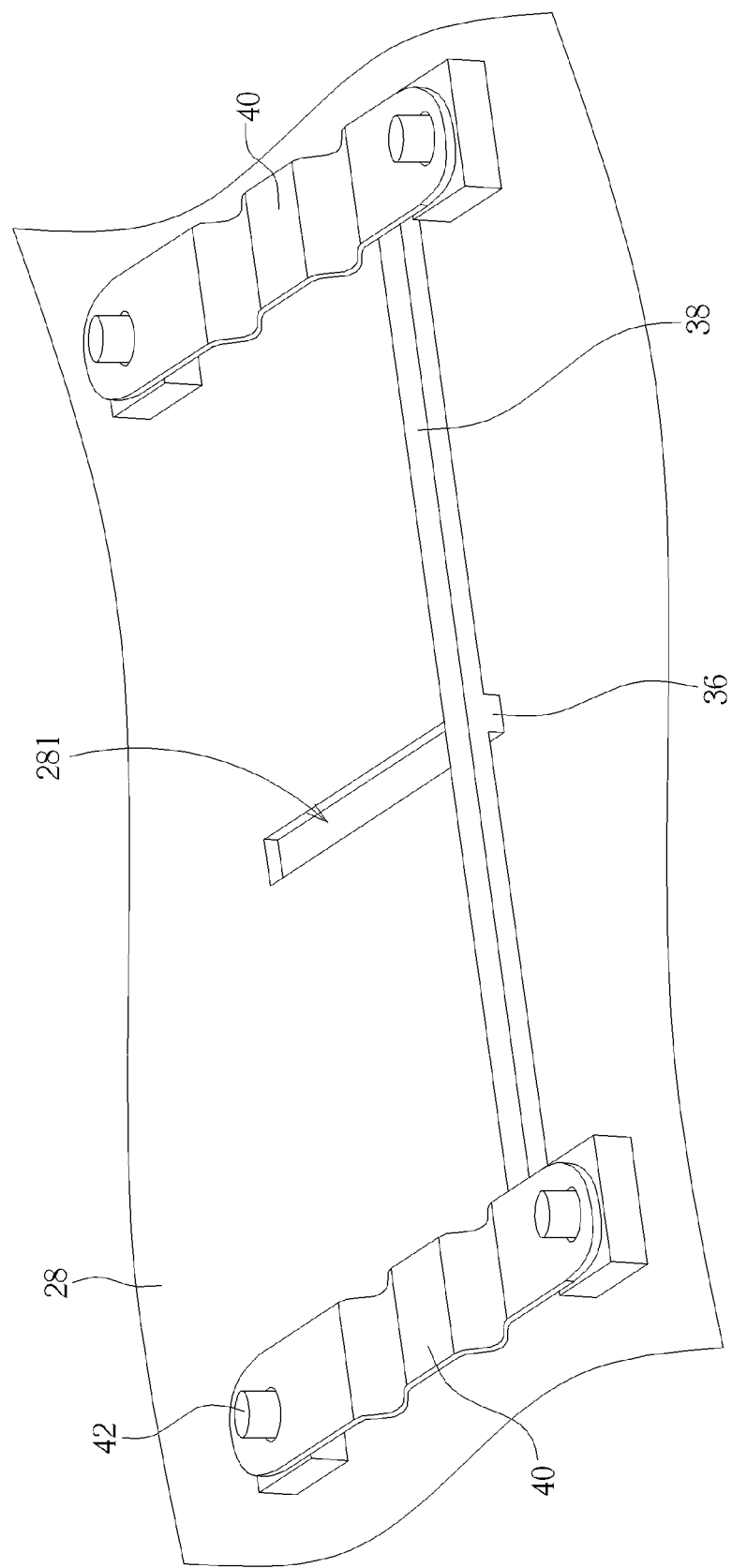
FIG. 5 is a diagram of the panel module in another view according to the embodiment of the present invention.
Figure 6:
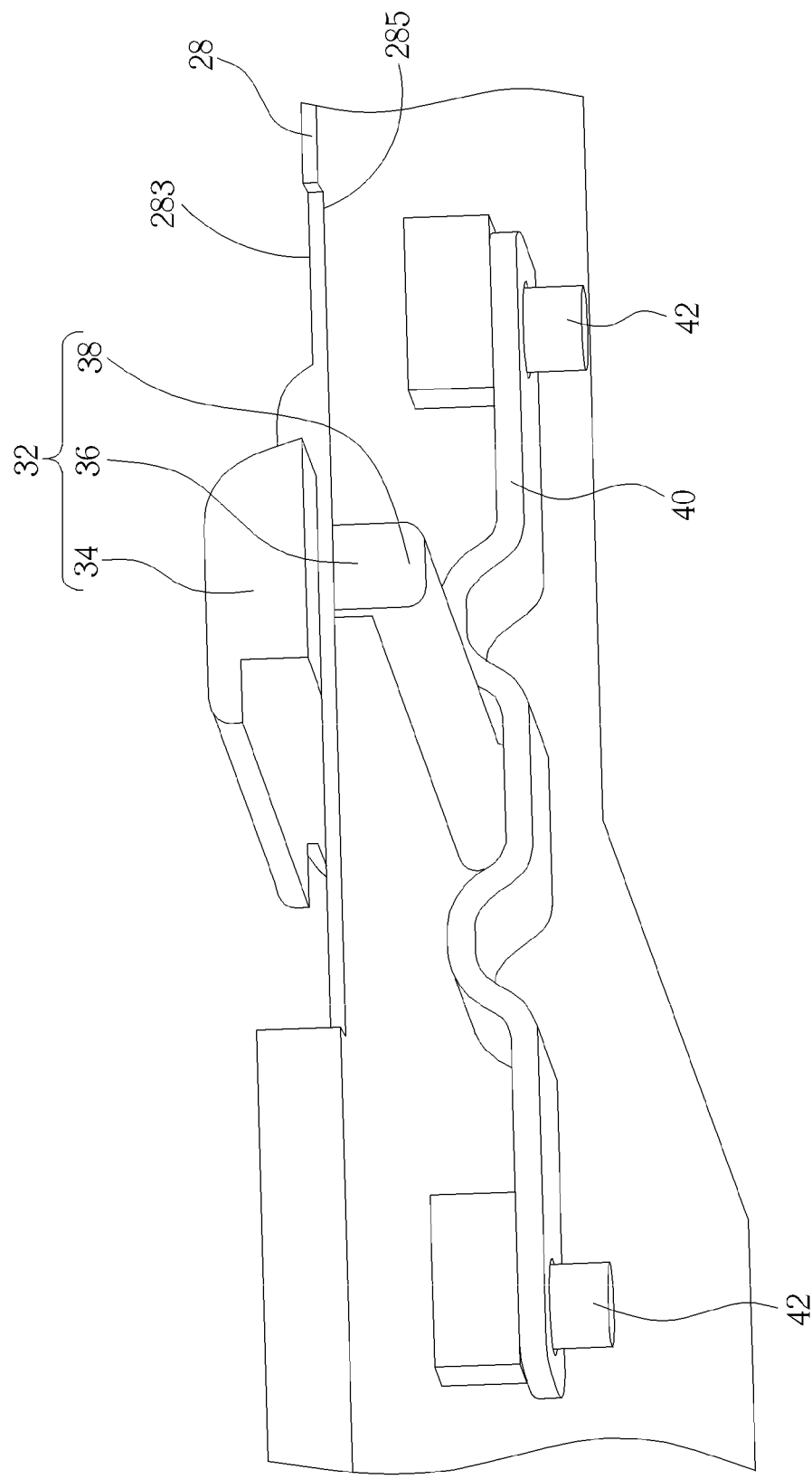
FIG. 6 is an inner structural diagram of the panel module according to the embodiment of the present invention.

Please refer to FIG. 5 and FIG. 6. FIG. 5 is a diagram of the panel module 16 in another view according to the embodiment of the present invention. FIG. 6 is an inner structural diagram of the panel module 16 according to the embodiment of the present invention. As shown in FIG. 5, the second hook 32 can further include two positioning portions 40 disposed on the body 28. Generally, the positioning portion 40 can be combined with a bottom of the body 28 via a heat stake 42 in a heat melt manner. Disposition of the positioning portion 40 is not limited to the above-mentioned embodiment, and depends on actual demand. Two ends of the constraining portion 38 are respectively blocked by the positioning portions 40. Each positioning portion 40 can be a multi-station stopper (which means a multi-stage stopper). The positioning portion 40 stops the movement of the constraining portion 38, and further simultaneously constrains a movement of the buckling portion 34 relative to the body 28.

As shown in FIG. 6, the buckling portion 34 of the second hook 32 can be disposed on an upper surface 283 of the body 28, and the constraining portion 38 can be disposed on a low surface 285 of the body 28. The positioning portion 40 can be the stopper with curved structures. Stage difference of the curved structures can block the constraining portion 38 when the constraining portion 38 moves to a position between the adjacent curved structures, so as to ensure that the buckling portion 34 can tightly buckle the privacy filter 20. Further, an external force can be applied to the second hook 32 to move the constraining portion 38 away from the curved structures.

For increasing the buckling stability of the fixing mechanism 26, the present invention further forms a hole 243 to position the second hook 32. As shown in FIG. 3 and FIG. 4, the plurality of holes 243 can be formed on an inner wall of the opening structure 241 of the bezel 24. The second hook 32 can further include at least one wedging portion 44 disposed on an end of the buckling portion 32. The wedging portion 44 can be wedged inside the corresponding hole 243 when the buckling portion 32 moves relative to the body 28 to be located at a predetermined position, so as to effectively constrain the movement of the buckling portion 32 with a combination of the constraining portion 38 and the positioning portion 40. Thus, the fixing mechanism 26 can stably fix the privacy filter 20.

In conclusion, the present invention combines the fixing mechanism with the bezel for preferable aesthetic. The fixing mechanism can be made of rubber material to provide friction-proofing function between the panel module and the casing. Because the fixing mechanism can be made of the rubber material, the first hook and the second hook can buckle on and depart from the privacy filter by the resilient recovering force. A combination of the constraining portion and the positioning portion and a combination of the hole and the wedging portion can utilize the resilient recovering force of the rubber material to execute assembly and disassembly of the privacy filter, so as to increase operational convenience of the fixing mechanism of the present invention.

Comparing to the prior art, the fixing mechanism of the present invention is adjustable according to the dimensions of the privacy filter. An edge of the privacy filter can be set inside the first hook, then the privacy filter is rotated to cover the panel, and the second hook is moved to the suitable position for buckling the privacy filter according to the dimensions of the privacy filter. Final, the opposite edges of the privacy filter can be tightly hooked by the first hook and the second hook. Therefore, the fixing mechanism of the present invention is aesthetic, and has advantages of, friction-proofing and adjustable function.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A fixing mechanism comprising:
   a body surrounding a bezel, a guiding slot being formed on a side of the body;
   a first hook disposed on the other side of the body; and
   a second hook slidably disposed on the side of the body, the second hook comprising:
   a buckling portion, the buckling portion and the first hook respectively buckling two edges of a privacy filter; and
   a guiding portion, an end of the guiding portion being connected to the buckling portion, the guiding portion being movably disposed inside the guiding slot so as to adjust a distance between the buckling portion and the first hook.

2. The fixing mechanism of claim 1, wherein the first hook and the second hook are respectively disposed on the opposite sides of the body.

3. The fixing mechanism of claim 1, wherein the second hook further comprises:
   a constraining portion, two ends of the guiding portion being respectively connected to the buckling portion and the constraining portion; and
   a positioning portion disposed on the body, the positioning portion being a multi-station stopper for stopping the constraining portion, so as to constrain a movement of the buckling portion relative to the body.

4. The fixing mechanism of claim 3, wherein the buckling portion is disposed on an upper surface of the body, and the constraining portion is disposed on a low surface of the body.

5. The fixing mechanism of claim 3, wherein the positioning portion is the stopper with curved structures, and the constraining portion is blocked between the adjacent curved structures.

6. The fixing mechanism of claim 3, wherein the positioning portion is combined with the body via a heat stake.

7. The fixing mechanism of claim 1, wherein the second hook further comprises:
   a wedging portion disposed on an end of the buckling portion, the wedging portion being wedged inside a hole on the bezel.

8. A panel module comprising:
   a panel, a privacy filter being disposed on a surface of the panel;
   a bezel, the panel being disposed inside the bezel, the bezel comprising an opening structure; and
   a fixing mechanism disposed on the bezel, the fixing mechanism comprising:
      a body surrounding a boundary of the bezel, a guiding slot being formed on a side of the body;
      a first hook disposed on the other side of the body; and
      a second hook slidably disposed on the side of the body and moving inside the opening structure of the bezel, the second hook comprising:
         a buckling portion, the buckling portion and the first hook respectively buckling two edges of the privacy filter; and
         a guiding portion, an end of the guiding portion being connected to the buckling portion, the guiding portion being movably disposed inside the guiding slot so as to adjust a distance between the buckling portion and the first hook.

9. The panel module of claim 8, wherein the first hook and the second hook are respectively disposed on the opposite sides of the body.

10. The panel module of claim 8, wherein the second hook further comprises:
    a constraining portion, two ends of the guiding portion being respectively connected to the buckling portion and the constraining portion; and
    a positioning portion disposed on the body, the positioning portion being a multi-station stopper for stopping the constraining portion, so as to constrain a movement of the buckling portion relative to the body.

11. The panel module of claim 10, wherein the buckling portion is disposed on an upper surface of the body, and the constraining portion is disposed on a low surface of the body.

12. The panel module of claim 10, wherein the positioning portion is the stopper with curved structures, and the constraining portion is blocked between the adjacent curved structures.

13. The panel module of claim 10, wherein the positioning portion is combined with the body via a heat stake.

14. The panel module of claim 8, wherein a hole is formed on an inner wall of the opening structure, the second hook further comprises a wedging portion disposed on an end of the buckling portion, and the wedging portion is wedged inside the hole on the bezel.

15. The panel module of claim 8, wherein the fixing mechanism is integrated with the bezel monolithically in a double injection molding manner.

* * * * *